United States Patent [19]

Matsumura

[11] Patent Number: 4,712,016

[45] Date of Patent: Dec. 8, 1987

[54] ALIGNMENT SYSTEM ALLOWING ALIGNMENT WHEN ALIGNMENT MARKS ARE ABSENT

[75] Inventor: Takashi Matsumura, Yokohama, Japan

[73] Assignee: Canon Kabushiki Kaisha, Tokyo, Japan

[21] Appl. No.: 823,736

[22] Filed: Jan. 29, 1986

[30] Foreign Application Priority Data

Jan. 30, 1985 [JP] Japan .................................. 60-014485

[51] Int. Cl.$^4$ ............................................. G01B 11/00
[52] U.S. Cl. .................................. 250/548; 356/401; 364/559
[58] Field of Search .................... 250/548, 557, 561; 356/394, 397, 399–401; 364/491, 559

[56] References Cited

U.S. PATENT DOCUMENTS

| 4,385,838 | 5/1983 | Nakazawa et al. | 356/401 |
| 4,531,060 | 7/1985 | Suwa et al. | 250/548 |

*Primary Examiner*—Edward P. Westin
*Attorney, Agent, or Firm*—Fitzpatrick, Cella, Harper & Scinto

[57] ABSTRACT

An alignment system usable in a semiconductor device manufacturing apparatus of step-and-repeat type for superposingly printing a pattern of a reticle onto each of patterns on a semiconductor wafer in a step-and-repeat manner. The alignment system is adapted to align each of the patterns of the wafer with respect to the pattern of the reticle, prior to exposure for printing the pattern, by use of alignment marks provided for each pattern of the wafer. In this alignment system, if the alignment marks for a particular pattern on the wafer are damaged or wiped off by the chemical or thermal treatment of the wafer, the alignment of the particular pattern of the wafer with respect to the pattern of the reticle is achieved on the basis of positional information detected from another alignment mark provided for another pattern of the wafer adjacent to or in the neighborhood of the particular pattern of the wafer, whereby the pattern of the reticle can be accurately overlaid on the particular pattern of the wafer.

7 Claims, 7 Drawing Figures

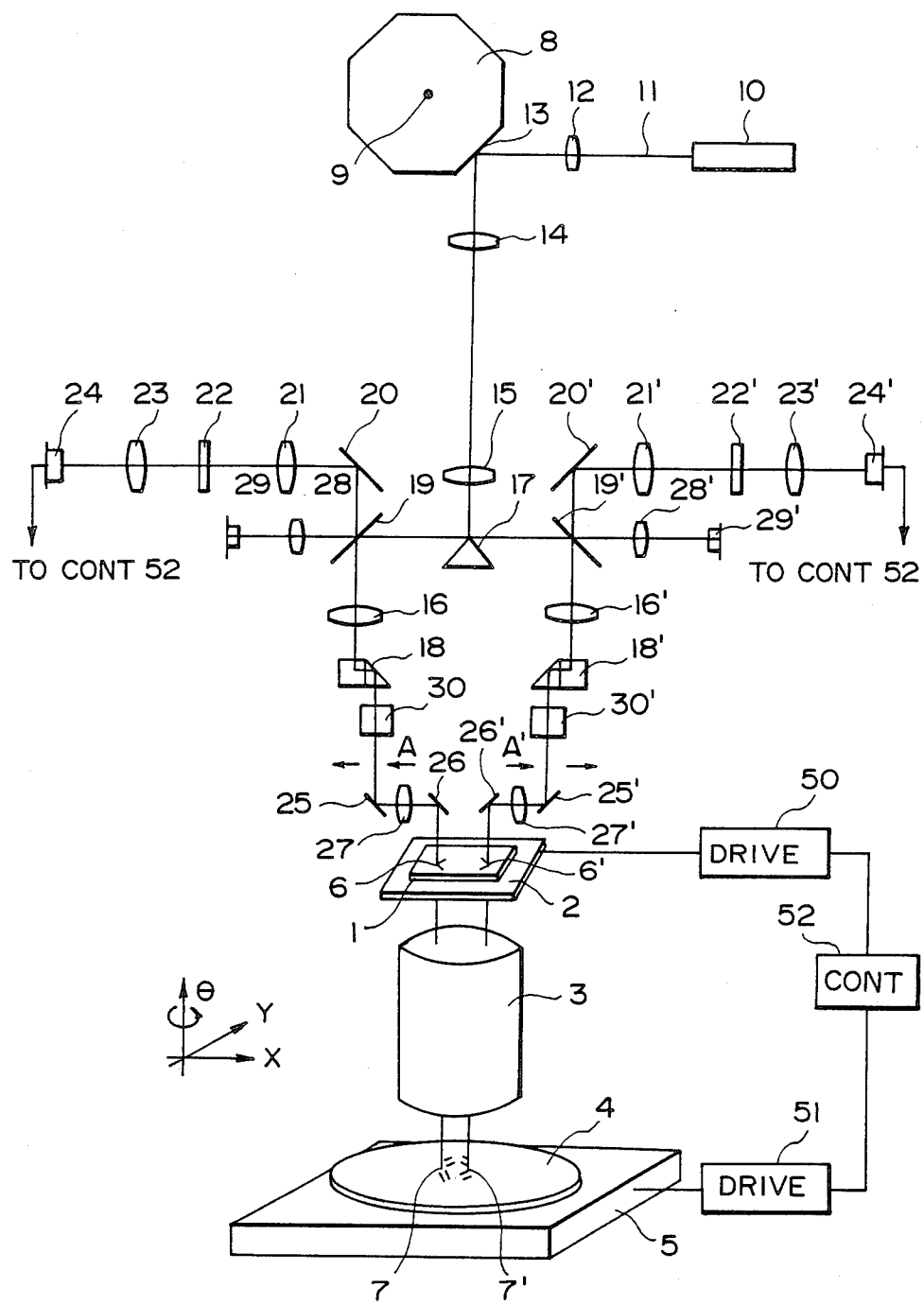
F I G. 1

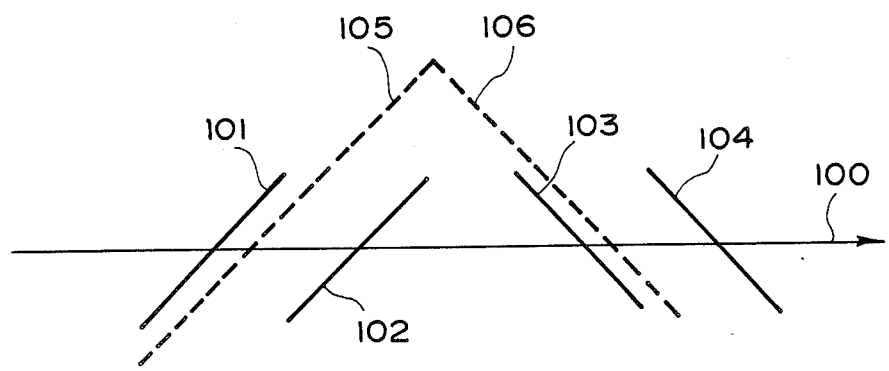
F I G. 4
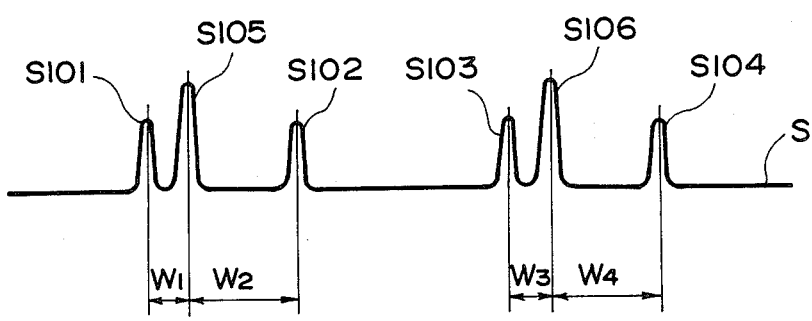
F I G. 5

ALIGNMENT SYSTEM ALLOWING ALIGNMENT WHEN ALIGNMENT MARKS ARE ABSENT

FIELD OF THE INVENTION AND RELATED ART

This invention relates to an alignment system for aligning two objects having alignment marks. More particularly, the invention is concerned with an alignment system usable in a semiconductor device manufacturing exposure apparatus, for aligning a semiconductor wafer with a photomask or reticle (hereinafter simply as "reticle") so as to allow an integrated-circuit pattern of the reticle to be accurately superimposed onto a pattern or patterns already printed on each of individual portions of the wafer.

Considerable improvements have been introduced in semiconductor device manufacturing exposure apparatuses, with a recent dramatic progress in semiconductor device integration technology. And, various types of exposure apparatuses have already been developed, such as contact type exposure apparatuses, proximity type exposure apparatuses, unit magnification projection exposure apparatuses using lens or mirror optics, and step-and-repeat projection exposure apparatuses (called "steppers") wherein images of a circuit pattern are transferred onto individual portions of a wafer, in a reduced scale, with the aid of reduction projection optics and in a step-and-repeat manner.

In the last-mentioned step-and-repeat type exposure apparatuses, alignment of the reticle and the wafer can be made in various ways. One representative example is a TTL (through-the-lens) die-by-die alignment technique. In this alignment process, each time one shot area on the wafer corresponding to one or more semiconductor chips is to be exposed to light passed through the reticle, any positional relation between the reticle and the wafer is detected through or by way of a projection lens system which is provided to project an image of a circuit pattern of the reticle onto the wafer, and then the detected positional deviation of the wafer with respect to the reticle is corrected. That is, in this alignment technique, the alignment of the reticle and the wafer is carried out for each of the shots or exposures. According to such die-by-die alignment technique, for this reason, high-accuracy alignment is assured for each shot and, as a result of which, high-accuracy pattern overlay is ensured. On the other hand, to employ the die-by-die alignment technique, it is necessary that each shot area on the wafer is provided with one or more alignment marks to allow alignment of each area with the reticle.

Manufacture of semiconductor devices includes various processes. In these processes, the wafer is subjected to a number of chemical and thermal treatments. This leads to a possibility of removal or wiping-off, or breakage of the alignment marks formed on the wafer and thus a possibility of failure of alignment. For example, in an alignment detecting system wherein an alignment mark formed on the wafer is scanned by a laser beam or the like and the laser beam scatteringly reflected from the alignment mark is detected to obtain electric signals bearing positional information about the alignment mark, such wiping-off or breakage of the alignment mark makes the accurate detection of the alignment mark signals impossible. If this occurs, then the alignment with respect to a particular shot area having such a defective alignment mark or not having any alignment mark would end in failure.

U.S. patent application Ser. No. 008,134 filed Jan. 22, 1987, which is a continuation of Ser. No. 633,347 filed July 23, 1984, now abandoned, and assigned to the same assignee of the subject application discloses an alignment method according to which the alignment is effected normally by use of a pair of alignment marks formed on the wafer. If one of the pair of the alignment marks is damaged, the alignment can be still accomplished according to the proposed method on the basis of the remaining complete alignment mark.

If, however, both of the pair of the alignment marks are damaged or removed, the alignment of such shot area having no complete alignment mark is not attainable even by the proposed alignment technique propose therein.

SUMMARY OF THE INVENTION

It is accordingly a primary object of the present invention to provide an alignment system for aligning a first object with respect to a second object by use of an alignment mark formed on the first object, the alignment system enabling comparable alignment even if the alignment mark formed on the first object is wiped off or damaged by any preceding treatment of the first object or the like.

It is another object of the present invention to provide an alignment system suitably usable in a semiconductor device manufacturing exposure apparatus of step-and-repeat type wherein alignment and exposure of a semiconductive wafer are repeatedly carried out in a step-and-repeat manner, the alignment system enabling accurate alignment of any shot area on the wafer even if an alignment mark which should exist in relation to that shot area is damaged or wiped out, thereby to improve the yield of the semiconductor devices per one wafer.

Briefly, according to one aspect of the present invention, there is provided in an alignment system for sequentially aligning individual portions of a first object with respect to a second object by use of alignment marks provided for the respective portions of the first object, said system comprising: driving means for moving stepwise the first object relative to the second object; means for detecting an alignment mark provided for such one of the portions of the first object that is positioned by the stepwise movement by said driving means so as to be correlated with the second object; aligning means for adjusting the relative position of the first and second objects on the basis of the detection by said detecting means so that the aforesaid one portion of the first object is placed in alignment with the second object, said aligning means adjusting the relative position of the first and second objects to align the aforesaid one portion of the first object with the second object on the basis of the detection, by said detecting means, of an alignment mark provided for another portion of the first object adjacent to or in the neighborhood of the aforesaid one portion, when the alignment mark provided for the aforesaid one portion is not detected by said detecting means.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of a semiconductor device manufacturing exposure apparatus of step-and-repeat type, into which an alignment system according to one embodiment of the present invention is incorporated.

FIG. 4 is an enlarged view schematically showing an example of alignment marks of a reticle and a wafer.

FIG. 5 is a schematic view showing a waveform containing electric signals obtainable from the alignment marks shown in FIG. 4.

DESCRIPTION OF THE PREFERRED EMBODIMENTS

Figure 2:
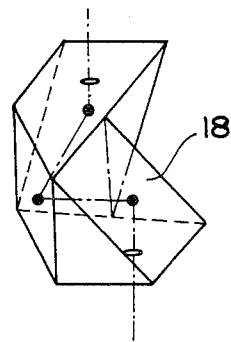
FIG. 2 is an enlarged perspective view showing one component of the alignment system of FIG. 1.

Referring first to FIG. 1, there is shown an optical arrangement of an alignment system according to one embodiment of the present invention, which system is incorporated into a semiconductor device manufacturing exposure apparatus of step-and-repeat type.

In FIG. 1, the exposure apparatus includes a reticle stage 2 for holding a reticle 1 having formed thereon an integrated circuit pattern (not shown) and alignment marks 6 and 6'; a projection lens system 3 having a reduced magnification for projecting, in a reduced scale, an image of the reticle 1 onto a wafer 4 having a sensitive layer (not shown) and alignment marks 7 and 7'; and a wafer stage 5 for holding the wafer 4 by vacuum suction or the like. The reticle stage 2 is connected to a diagrammatically illustrated drive unit 50 while the wafer stage 5 is connected to another diagrammatically illustrated drive unit 51, such that each of the reticle stage 2 and the wafer stage 5 is translatable in a plane (in X and Y directions) and rotatable (in $\theta$ direction). A control unit 52 is connected to the drive units 50 and 51, respectively, to control the movement of the reticle stage 2 and the wafer stage 5. The control unit 52 is also arranged to effect various operations and calculations, which will be described later in detail, necessary for aligning the reticle and the wafer. The drive unit 51 is effective to move the wafer stage 5 stepwise in the X and Y directions, so as to sequentially place individual portions (shot areas) of the wafer under the projection lens system 3.

While not shown in the drawing, the exposure apparatus further includes a radiation energy source for producing a radiation energy, such as light, to which the sensitive layer on the wafer 4 is sensitive, and a guiding system for directing the radiation energy to the reticle 2 to irradiate the same with the radiation energy. By exposing the sensitive layer on the wafer 4 to the radiation energy passed through the reticle 2, the integrated circuit pattern of the reticle 2 is transferred through the projection lens system 3 onto the wafer 4.

In operation, as an example, the wafer stage 5 is moved stepwise by the driving unit 51 in the X and Y directions to effect the step-and-repeat movement, while the reticle stage 2 is moved by the driving unit 50 in the X, Y and $\theta$ directions so as to initially set the reticle 1 with respect to the exposure apparatus. Further, the reticle stage 2 is moved in the X and Y directions while the wafer stage 5 is moved in the $\theta$ direction, thereby to align the reticle 1 and the wafer 4. Of course, the alignment is attainable by moving only the reticle stage 2 in the X, Y and $\theta$ directions. As a further alternative, the alignment is attainable by displacing the wafer stage 5 only.

While, in FIG. 1, only one pair of alignment marks 7 and 7' are illustrated for the wafer 4, this is merely for convenience in illustration. Actually, the wafer 4 is provided with pairs of alignment marks, the number of the pairs corresponding to the number of shot areas on the wafer, in this embodiment.

The alignment marks on the reticle 1 and wafer 4, when a projection optical system, which is not unit magnification projection optical system, is provided therebetween, are dimensioned such that one has the same size as the other when the one is projected therethrough to the other, whether the projection is one direction or the other through the projection lens. In this embodiment, the value obtained by dividing the dimension of the reticle alignment mark by that of the wafer alignment mark is equal to the magnification (reduction) of the reduction projection lens.

The alignment system includes a rotary polygonal mirror 8 rotatable about a rotational axis 9. A laser beam generated by a laser source 10 is condensed on a point 13 on a mirror surface of the polygonal mirror 8 by a lens 12. There are provided intermediate lenses 14, 15 and 16 for relaying. A triangular prism 17 is so positioned that the apex thereof is right on the optical axis, so that one scan is divided into the right side and left side. A scanning direction changing prism 18 is effective to change the scanning deflection in the direction within the plane of the drawing to the scanning deflection in the direction perpendicular to the sheet of the drawing. FIG. 2 shows an example of the scanning direction changing prism.

A half mirror 19 is effective to introduce the reflected laser beam toward a photoelectric detection system including a mirror 20, a lens 21, a spatial frequency filter 22, a condenser lens 23 and a photodetector 24. Designated by reference numerals 25 and 26 are full-mirrors; and 27, an f-$\theta$ objective lens.

The alignment system further includes a condenser lens 28 and a photodetector 29 for detecting a synchronization signal. A portion of the laser beam incident on the half mirror 19 passes therethrough and enters into the condenser lens 28. By the condenser lens 28, the portion of the laser beam is converged and is incident on the photodetector 29. Thus, the photodetector 29 is effective to detect the originating point and terminating point of the laser beam scanning.

It will be seen from the drawing that the signal detecting device comprises left-hand side and right-hand side portions which are fully symmetric with each other. Provided that an operator would stand at a position facing the apparatus as it is illustrated in the drawing, the portion including the elements designated by numerals with primes will hereinafter be referred to as "right-hand signal detecting system" whereas the portion including the elements designated by numerals without primes will hereinafter be referred to as "left-hand signal detecting system".

In the objective lens system, each of the mirrors 26 and 26' is movable in the X direction as shown by an arrow A (A'). The movement of the mirror 26 or 26' in the X direction is effective to displace, in the X direction, the laser scanning position with respect to the left-hand signal detecting system or the right-hand signal detecting system, independently from the other signal detecting system. Optical path length correcting systems 30 and 30' are provided each of which is adapted to maintain the optical path length constant irrespective of the movement of the mirror 26 or 26'. By this, the focus position of the scanning laser beam is maintained fixed.

As for the displacement in the Y direction, on the other hand, the optical arrangement as a whole of the position detecting system is movable in the Y direction.

Figure 3:
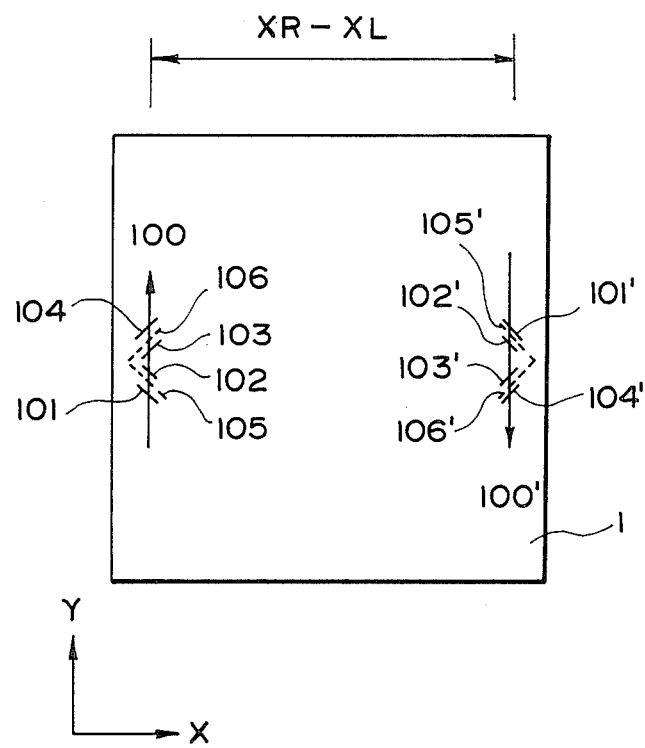
FIG. 3 is a schematic view showing an example of location of alignment marks on a reticle.

Referring now to FIG. 3, there are shown a pair of alignment marks of the reticle 1 and a pair of alignment marks of the wafer 4, the latter being shown as being projected onto the reticle 1 by the projection lens system 3. One of the pair of the reticle alignment marks and mating one of the pair of the wafer alignment marks are shown in detail in an enlarged view of FIG. 4. As is best shown in FIG. 3, left-hand one of the reticle alignment marks comprises linear mark elements 105 and 106 having their ends connected at a right angle. Similarly, right-hand one of the reticle alignment marks comprises linear mark elements 105' and 106' having their ends connected at a right angle. On the other hand, left-hand one of the wafer alignment marks, mating with the left-hand reticle alignment mark, comprises four linear mark elements 101–104. Of these mark elements, the mark elements 101 and 102 extend in parallel to each other, while the mark elements 103 and 104 extend in parallel to each other. Also, the direction of extension of the mark elements 101 and 102 is orthogonal to that of the mark elements 103 and 104. Similarly, right-hand one of the wafer alignment marks, mating with the right-hand reticle alignment mark, comprises four linear mark elements 101'–104' having the same arrangement of the mark elements 101–104 of the left-hand wafer alignment mark. Details of such alignment marks are disclosed in U.S. Pat. No. 4,167,677 issued Sept. 11, 1979. So, further description of these alignment marks will be omitted here, by reference to the aforementioned U.S. Patent Specification.

When, in FIG. 4, one of the reticle alignment mark and mating one of the wafer alignment mark, which are in a positional relation as shown in FIG. 4, are scanned by a laser beam along a scan line 100, electric signals such as shown at S101–S106 in FIG. 5 are produced from corresponding one of the photodetectors 24 and 24' shown in FIG. 1. Of these electric signals, the signals S101–S104 correspond respectively to the mark elements 101–104 of the wafer alignment mark, while the signals S105 and S106 correspond respectively to the mark elements 105 and 106 of the reticle alignment mark. So, any positional deviation between the reticle and the wafer can be detected by measuring intervals W1, W2, W3 and W4 (with respect to time) between the signals S101 and S105, between the signals S105 and S102, between the signals S103 and S106, and between the signals S106 and S104, respectively.

The positional deviations $\Delta XL$ and $\Delta YL$ between the left-hand reticle alignment mark and the right-hand wafer alignment mark, to be detected by the left-hand signal detecting system can be calculated according to the following equations:

$$\Delta XL = (W1 - W2 - W3 + W4)/4 \quad (1)$$

$$\Delta YL = (W1 - W2 + W3 - W4)/4 \quad (2)$$

On the other hand, the positional deviations $\Delta XR$ and $\Delta YR$ between the right-hand reticle alignment mark and the right-hand wafer alignment mark, to be detected by the right-hand signal detecting system can be calculated according to the following equations:

$$\Delta XR = (-W1' + W2' + W3' - W4')/4 \quad (3)$$

$$\Delta YR = (-W1' + W2' - W3' + W4')/4 \quad (4)$$

From the foregoing, it is seen that the positional deviation $\Delta\theta$ between the reticle and the wafer in the rotational direction can be given by the following equation:

$$\Delta\theta = (\Delta YR - \Delta YL)/(XR - XL) \quad (5)$$

wherein XL and XR are the positions of the left-hand side and right-hand side alignment marks with respect to the center of the reticle, and "XR−XL" is the distance between these alignment marks.

Figure 6:
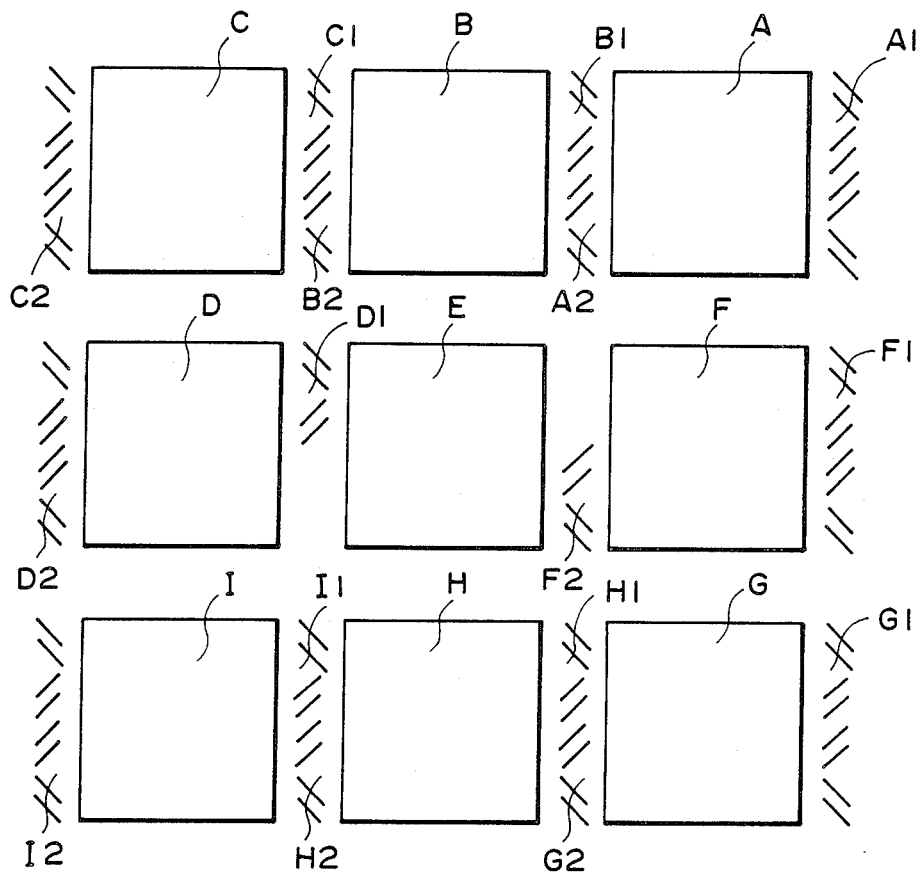
FIG. 6 is a schematic view showing an example of positional arrangement of shot areas and alignment marks therefor on a wafer.

FIG. 6 shows an example of arrays of shot areas on the wafer and arrays of alignment marks provided for these shot areas. Denoted in FIG. 6 by reference characters A–I are the shot areas, while denoted by reference characters A1, A2, B1, B2 ... I1 and I2 are the alignment marks provided for these shot areas. In this example, two alignment marks, i.e. left-hand side and right-hand side alignment marks, are provided for each shot area. Usually, each time one of the shot areas A–I is positioned at the exposure station by the stepwise movement of the wafer stage, the positional deviation between the reticle and the wafer is detected by use of the left-hand side and right-hand side alignment marks provided for the one shot area. If the exposures of the shot areas A–I are to be carried out in this order, the alignment of the shot areas A–D is attainable by use of their own alignment marks A1 and A2; B1 and B2; C1 and C2; and D1 and D2. For the shot area E, however, both of two alignment marks have been wiped off by the preceding treatment of the wafer. So, the alignment of this shot area by use of its own alignment marks is no more attainable. This means that the circuit pattern of the reticle 1 can not be accurately overlaid on a pattern or patterns already printed on the shot area E. This in turn leads to degradation of the yield of the integrated circuits per one wafer.

According to the present invention, in view of the above, the shot area E is temporarily skipped. That is, the alignment and exposure operation relative to the shot area E is suspended, and, in this example, the alignment and exposure operation relative to each of the remaining shot areas F–I is carried out. After the alignment and exposure operations relative to the shot areas A–D and F–I adjacent to or surrounding the shot area E are all completed, an average of the positional deviations detected with reference to the shot areas A–D and F–I is calculated. This calculation is carried out by the control unit 52 shown in FIG. 1. The thus detected average positional deviation is taken as the actual positional deviation between the reticle and the wafer in relation to the shot area E, and the relative position of the reticle and the wafer is adjusted by the driving unit 50 and/or the driving unit 51 (FIG. 1) in accordance with the detected average deviation. By this, comparable alignment of the shot area E is attainable.

More specifically, the positional deviation of the shot area E in the X and Y directions, at two points, can be calculated in the following manner:

$$\Delta XL_E = \Sigma \Delta XL/8 \quad (6)$$

$$\Delta YL_E = \Sigma \Delta YL/8 \quad (7)$$

$$\Delta XR_E = \Sigma \Delta XR/8 \quad (8)$$

$$\Delta YR_E = \Sigma \Delta YR/8 \quad (9)$$

wherein $\Sigma\Delta XL$ is the sum of the detected positional deviations in the X direction of the shot areas A-D and F-I with respect to the left-hand alignment marks; $\Sigma\Delta YL$ is the sum of the detected positional deviations in the Y direction of the same shot areas with respect to the left-hand alignment marks; $\Sigma\Delta XR$ is the sum of the detected positional deviations in the X direction of the same shot areas with respect to the right-hand alignment marks; and $\Sigma\Delta YR$ is the sum of the detected positional deviations in the Y direction of the same shot areas with respect to the right-hand alignment marks.

Figure 7:
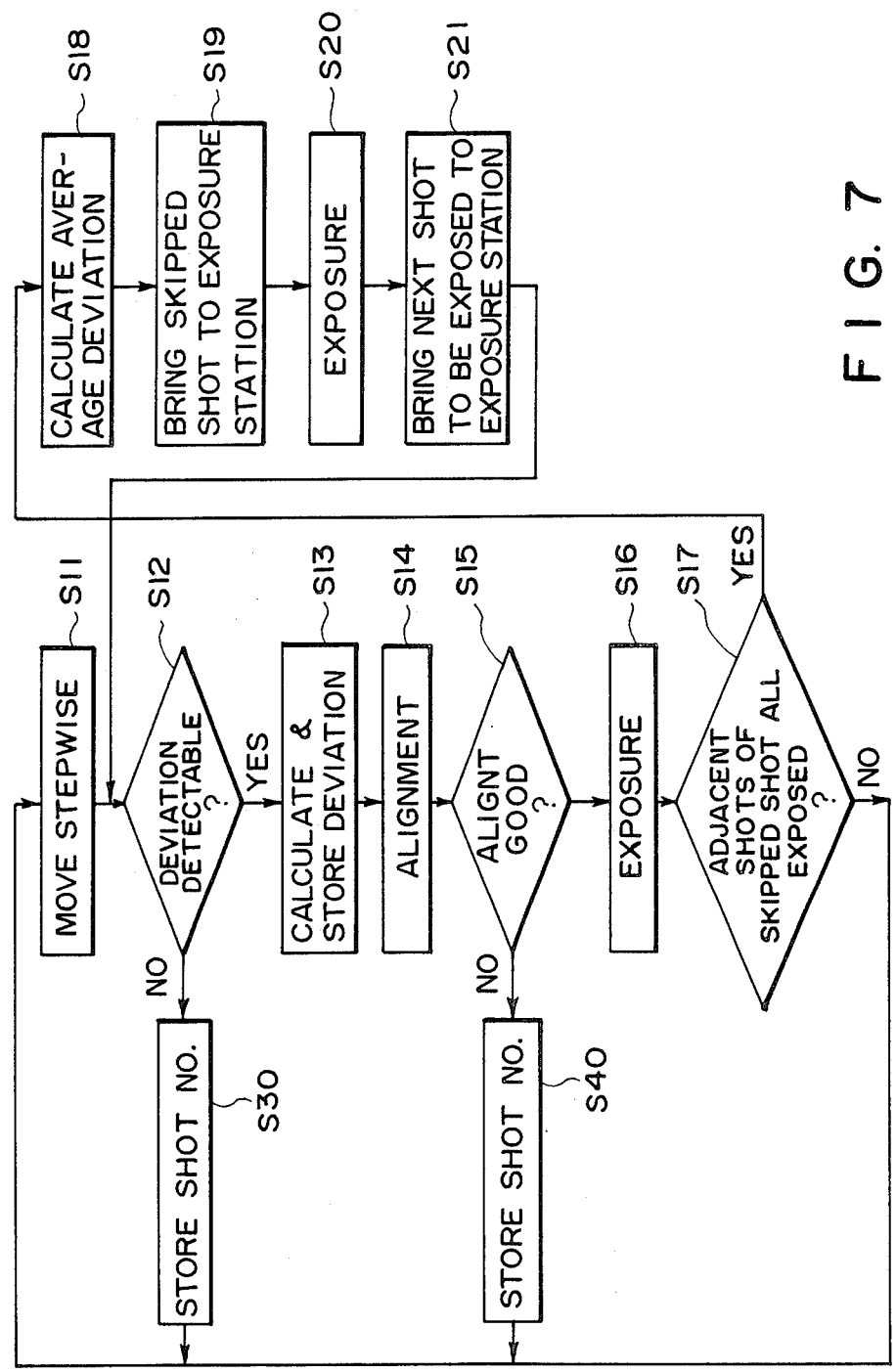
FIG. 7 is a flow chart showing the alignment and exposure operation in a semiconductor device manufacturing exposure apparatus into which an alignment system according to one embodiment of the present invention is incorporated.

In this embodiment, the alignment operation for the shot area E is actually carried out in accordance with a flow shown in FIG. 7. First, with respect to each of the shot areas A-D and F-I, the positional deviation thereof at a time after completion of the stepwise movement of the wafer stage 5 and before the adjustment of the relative position of the reticle and the wafer for the sake of alignment of the same shot area, is detected in the manner described in the foregoing, and the detected positional deviation is stored (Step S13). After completion of exposures relative to the shot areas A-D and F-I, average positional deviations $\Delta XL_E$, $\Delta YL_E$, $\Delta XR_E$ and $\Delta YR_E$ are calculated (Step S18) from the stored positional deviations. Subsequently, in the control unit 52, the thus detected average deviations are added to a predetermined amount of movement in the X and Y directions necessary for displacing the wafer, which has been positioned so that the shot area I is placed at the exposure station (under the projection lens system 3), so as to place the shot area E at the exposure station. In accordance with the thus obtained amount of movement, the wafer stage 5 is moved stepwise to place the shot area E exactly at the exposure station (Step S19).

In this embodiment, the stepwise movement of the wafer 4 by the wafer stage 5 (Step S10) is controlled by the control unit 52 so that each shot area is displaced, when it is to be subjected to the alignment and exposure operation, to its own reference position, which is predetermined, in respect to a lattice or grid coordinate system (i.e. to a corresponding one of individual positions determined by the designing or calculation). This means that, when a particular shot area (hereinafter "next shot area") adjacent to a shot area being exposed (hereinafter "current shot area") is to be forwarded to the exposure station, the amount of movement necessary for displacing the wafer 4 from a current-shot-area exposing position to a next-shot-area exposing position is equal to a value obtained by correcting the distance between two adjacent reference positions in respect to the grid coordinate system by an amount corresponding to the distance through which the wafer has been displaced relative to the reticle during the "alignment operation" (after stepwise movement) effected with respect to the current shot area. Therefore, what is detected at the time of completion of the stepwise movement for forwarding a certain shot area to the exposure station, is the positional deviation between the reticle and that shot area which is exactly located at its own reference position in respect to the grid coordinate system.

Discrimination at Step S12 as to whether the positional deviation is detectable or not is effected by discriminating whether or not a predetermined number of alignment mark signals are detected. Also, this may be made by additionally discriminating whether or not alignment mark signals having a satisfactory level and a common waveform are detected.

Referring now to FIGS. 1 and 7, the alignment and exposure operation in the present embodiment is described in more detail. First, at Step S11, the wafer 4 is moved stepwise by the wafer stage 5 for positioning of one of the shot areas. Subsequently, the reticle 1 and the wafer 4 are scanned by the laser beam so as to detect the reticle alignment marks 6 and 6' and the wafer alignment marks 7 and 7'. If, by this laser beam scan, a predetermined number of alignment mark signals are detected with respect to each of the left-hand side and right-hand side alignment marks of the reticle and the wafer, the sequence proceeds to Step S13 so that the positional deviation between the reticle and the one shot area is calculated and stored into an unshown memory of the control unit 52.

If, on the other hand, the alignment mark signals of the predetermined number are not detected with respect to the left-hand and/or the right-hand alignment marks of the reticle and the wafer (which means that one of or both of the left-hand and right-hand wafer alignment marks are lacking), the sequence proceeds to Step S30 from Step S12. At Step S30, the number of the shot area having a defective or no alignment mark (the area E in FIG. 6 example) is stored into the memory. Then, the sequence returns to Step S11, whereby the shot area such as the area E in FIG. 6 is skipped.

If the positional deviation is detectable, the sequence proceeds to Step S14 by way of Step S13 described above, whereby the alignment is carried out on the basis of the positional information stored at Step S13. Subsequently, at Step S15, the reticle and wafer alignment marks are scanned again by the laser beam, and whether or not the alignment is good is discriminated. If not good, the number of the shot area is stored (Step S40) and the next shot area is forwarded to the exposure station (Step S11). If good, the sequence proceeds to Step S16 whereby the exposure is effected.

Subsequently, at Step S17, discrimination is made as to whether the exposures relative to the shot areas (A-D and F-I in FIG. 6 example) surrounding the skipped shot area (E in FIG. 6 example) whose shot number has been stored at Step S30 or S40 are all completed or not. If not completed, the sequence returns to Step S11, so the wafer 4 is again moved stepwise. If completed, the sequence proceeds to Step S18 whereat the above-described average values of the positional deviations detected with reference to the adjacent shot areas are calculated. Thereafter, the thus detected average deviations are added to the amount of stepwise movement necessary for displacing the wafer from its current position, at which the current shot area (the shot area I in FIG. 6 example) is placed exactly at the exposure station, to such position at which the skipped shot area (the shot area E in FIG. 6 example) is placed at the exposure station. In accordance with the thus calculated amount, the wafer 4 is moved stepwise (Step S19). Then, at Step S20, the exposure of the skipped shot area is effected so that the circuit pattern of the reticle 1 is transferred onto the skipped shot area, the shot area E in FIG. 6 example. Subsequently, the wafer is again moved stepwise (Step S21) so as to bring the next shot area, to be exposed, to the exposure station. Thus, the sequence returns to Step S11, and the operations described above are repeated until the exposures relative to all the shot areas on the wafer 4 are completed.

The alignment process described in the foregoing can be modified in various ways. For example, the calculation of the positional deviation for any skipped shot area, i.e. the shot area E in FIG. 6 example, may be modified in the following manner:

(1) For the calculation of the average values, any extraordinary value of the positional deviations detected with reference to the adjacent shot areas is disregarded;

(2) The function of the positional deviations obtained with respect to the adjacent or surrounding shot areas is detected by a known least squares method, and an approximation of the positional deviation is detected;

(3) The average positional deviation is calculated from the positional deviations detected with reference to four adjacent shot areas, i.e. the shot areas B, D, F and H or the shot areas A, C, G and I in the case of the FIG. 6 example, not from the positional deviations detected with reference to all the shot areas surrounding the skipped shot area;

(4) Adjacent two shot areas, such as the shot areas B and H or the shot areas D and F in FIG. 6 example, are selected for the sake of calculation of the positional deviation of the skipped shot area;

(5) If the skipped shot area is located at a peripheral portion of the wafer, one or more effective shot areas for which correct alignment has been achieved are selected for the sake of calculation of the positional deviation of the skipped shot area; or (6) An appropriate combination of the foregoing modifications (1)-(5) is employed, or alternatively, the result of calculation by such combination is used in combination with an average calculated from the positional deviations of all the shot areas surrounding the skipped shot area.

It is a further possible alternative to calculate an average from the positional deviations of all the shot areas defined on the wafer, except for the skipped shot area. An appropriate one of these modifications may be selected, according to the conditions. Such selection may be made automatically or manually.

As a further alternative, the alignment system may be modified such that, if only one of the two wafer alignment marks is defective, the alignment is accomplished by use of the other, complete alignment mark in the manner as disclosed in the above-mentioned U.S. patent application Ser. No. 008,134).

In accordance with the present invention, as has hitherto been described, the alignment is attainable even if no alignment mark is detectable due to the peeling-off or wiping-out by the chemical or thermal treatment of the wafer. As a result, the yield of the semiconductor integrated circuits per one wafer can be improved significantly.

While the invention has been described with reference to the structures disclosed herein, it is not confined to the details set forth and this application is intended to cover such modifications or changes as many come within the purposes of the improvements or the scope of the following claims.

What is claimed is:

1. An alignment system for sequentially aligning individual portions of a first object with respect to a second object by use of alignment marks provided for the respective portions of the first object, said system comprising:

driving means for moving stepwise the first object relative to the second object;

means for detecting an alignment mark provided for such one of the portions of the first object that is positioned by the stepwise movement by said driving means so as to be correlated with the second object;

aligning means for adjusting the relative position of the first and second objects on the basis of the detection by said detecting means so that the aforesaid one portion of the first object is placed in alignment with the second object, said aligning means adjusting the relative position of the first and second objects to align the aforesaid one portion of the first object with the second object on the basis of the detection, by said detecting means, of an alignment mark provided for another portion of the first object in the neighborhood of the aforesaid one portion, when the alignment mark provided for the aforesaid one portion is not detected by said detecting means.

2. A system according to claim 1, wherein said aligning means includes means for calculating the positional deviation of each of the individual portions of the first object with respect to the second object, on the basis of signals from the alignment mark as detected by said detecting means.

3. A system according to claim 2, wherein said calculating means calculates the positional deviation of the aforesaid one portion of the first object with respect to the second object on the basis of the detection, by said detecting means, of alignment marks provided for other portions of the first object in the neighborhood of the aforesaid one portion, when the alignment mark provided for the aforesaid one portion is not detected by said detecting means.

4. A system according to claim 3, wherein said calculating means calculates an average of the positional deviations detected by said detecting means from alignment marks provided for other portions of the first object in the neighborhood of the aforesaid one portion, when the alignment mark provided for the aforesaid one portion is not detected by said detecting means.

5. A system according to claim 2, wherein said calculating means calculates the positional deviation of the aforesaid one portion of the first object with respect to the second object on the basis of the detection, by said detecting means, of an alignment mark provided for another portion of the first object contiguous to the aforesaid one portion, when the alignment mark provided for the aforesaid one portion is not detected by said detecting means.

6. A method of sequentially aligning individual portions of a first object with respect to a second object by use of alignment marks provided for the respective portions of the first object, said method comprising moving stepwise the first object relative to the second object;

detecting an alignment mark provided for such one of the portions of the first object that is positioned by the stepwise movement so as to be correlated with the second object;

adjusting the relative position of the first object and the second object on the basis of the detection so that the aforesaid one portion of the first object is placed in alignment with the second object, wherein the relative position of the first and second objects is adjusted to align the aforesaid one portion of the first object with the second object by use of an alignment mark provided for another portion of the first object in the neighborhood of the aforesaid one portion, when the alignment mark provided for the aforesaid one portion is not detected.

7. A method according to claim 6, further comprising sequentially transferring a pattern of the second object onto the individual portions of the first object.

* * * * *